(12) United States Patent
Whittaker

(10) Patent No.: US 7,372,389 B2
(45) Date of Patent: May 13, 2008

(54) ANALOGUE TO DIGITAL CONVERTER, AND METHOD OF ANALOGUE TO DIGITAL CONVERSION

(75) Inventor: Andrew Gerard Whittaker, Preston (GB)

(73) Assignee: Jennic Limited (GB)

( * ) Notice: Subject to any disclaimer, the term of this patent is extended or adjusted under 35 U.S.C. 154(b) by 0 days.

(21) Appl. No.: 11/522,501

(22) Filed: Sep. 15, 2006

(65) Prior Publication Data

US 2008/0068243 A1    Mar. 20, 2008

(51) Int. Cl.
*H03M 1/12* (2006.01)

(52) U.S. Cl. .................. 341/155; 341/161; 341/162; 341/163

(58) Field of Classification Search ............... 341/155, 341/161, 163
See application file for complete search history.

(56) References Cited

U.S. PATENT DOCUMENTS 5,471,208 A * 11/1995 Sauer ..................... 341/120
5,831,562 A * 11/1998 Van Auken et al. ....... 341/122
6,304,208 B1 * 10/2001 Nagashima ............... 341/172
6,608,580 B2 * 8/2003 Hsueh ...................... 341/155
7,113,749 B2 * 9/2006 Smith et al. ............. 455/67.11

* cited by examiner

*Primary Examiner*—Khai M. Nguyen
(74) *Attorney, Agent, or Firm*—Wilmer, Cutler, Pickering, Hale & Dorr, LLP

(57) ABSTRACT

Embodiments of the invention provide an analogue to digital converter comprising a dual differential digital to analogue converter (DAC) having first and second digital inputs for first and second digital input signals respectively, and having first and second analogue differential outputs for first and second differential output signals respectively, where the first and second digital output signals are associated with the first and second digital inputs respectively; storage for storing a DAC digital input value; logic for deriving the first and second digital input signals from the DAC digital input value, such that the difference between the first and second differential output signals from the DAC represents the DAC digital input value; a comparator for comparing the first and second differential output signals from the DAC with an analogue input signal and providing a comparator output; and a controller, responsive to the comparator output, for modifying the DAC digital input value such that the DAC digital input value substantially represents the analogue input signal.

25 Claims, 9 Drawing Sheets

US 7,372,389 B2

ANALOGUE TO DIGITAL CONVERTER, AND METHOD OF ANALOGUE TO DIGITAL CONVERSION

FIELD OF THE INVENTION

Embodiments of the invention relate to an analogue to digital converter, and a method of analogue to digital conversion.

BACKGROUND TO THE INVENTION

Analogue to digital converters are used in many applications where it is desirable to convert an analogue value (such as, for example, an analogue voltage) to a digital value. The digital value may then, for example, be processed using digital processing.

Many analogue to digital converters (ADCs) use a digital to analogue converter (DAC). A digital value stored within the ADC is converted to an analogue voltage using the DAC. The resulting analogue voltage is then compared with the analogue input voltage using an analogue comparator. The output of the comparator, which indicates whether the analogue output of the DAC is higher or lower than the analogue input voltage, is then used in an analogue to digital conversion to modify the digital value, until the output of the DAC is substantially equal to the input voltage. At this point, the digital value represents the analogue input voltage, and is provided as the output from the ADC.

The digital value may be modified using a method of successive approximation. In an example of this method, the bits of the digital value are set to 0, except for the most significant bit (MSB) which is set to 1. If the output of the comparator indicates that the output of the DAC is too high, and thus the digital value is too high, then this bit is reset to 0, otherwise it remains at 1. The process is then repeated for the next most significant bit, and so on, until all the bits of the digital value have been considered. The digital value then substantially represents the analogue input voltage. This approach has the advantage that a single conversion requires the same time and/or number of clock cycles, regardless of the magnitude of the input voltage.

A number of different DAC architectures can be used within an ADC. A string DAC, for example, has a string of ($2^n$−1) resistors connected in series between a power supply voltage and ground, where n is the number of DAC bits. A number of switches are employed to connect the output of the DAC to a point along the resistor string, depending on the value of the digital input to the DAC. The resistor string acts as a potential divider, and the output, therefore, has an appropriate voltage level that represents the digital input to the DAC. A string DAC has good accuracy, as it is possible to produce a number of highly matched resistors on an integrated circuit, and can operate at high speeds. However, the large number of resistors in a string DAC may introduce high levels of noise into the output of the DAC. The number of resistors in a string DAC can be reduced by forming a segmented DAC by cascading two or more string DACs that have fewer resistors in each respective resistor string, at the possible expense of speed and/or accuracy.

It is an aspect of embodiments of the invention to at least mitigate one or more of the problems of the prior art.

SUMMARY OF THE INVENTION

According to a first aspect of embodiments of the invention, there is provided an analogue to digital converter comprising: a dual differential digital to analogue converter (DAC) having first and second digital inputs for first and second digital input signals respectively, and having first and second analogue differential outputs for first and second differential output signals respectively, where the first and second digital output signals are associated with the first and second digital inputs respectively; storage for storing a DAC digital input value; logic for deriving the first and second digital input signals from the DAC digital input value, such that the difference between the first and second differential output signals from the DAC represents the DAC digital input value; a comparator for comparing the first and second differential output signals from the DAC with an analogue input signal and providing a comparator output; and a controller, responsive to the comparator output, for modifying the DAC digital input value such that the DAC digital input value substantially represents the analogue input signal.

Thus the digital to analogue converter (DAC) within the analogue to digital converter (ADC) may have a resistor string having fewer bits than the output of the ADC. The digital input signals for the DAC can represent a digital value having one bit more than each of the input signals. For example, two 11-bit differential digital signals can represent a 12-bit digital signal. The DAC can contain a single resistor string that is used to generate the output signals associated with both of the input signals. Also, the differential nature of the output signals from the DAC allows less bits to be used in the resistor string in the DAC. For example, a 10-bit resistor string can be used to generate a differential analogue output signal from an 11-bit digital input signal. In other examples of embodiments of the invention, other numbers of bits may be used.

The analogue output of a DAC is a function of a digital input to the DAC. For example, the analogue output signal from a DAC is a linear function of the digital input signal. For example, the analogue output signal may be schematically proportional to the value of the digital input signal. Therefore, the analogue output signal of a DAC represents the digital input signal. In the case of a differential output from a DAC, for example, the difference between differential analogue output signals represents the digital input signal. Similarly, the DAC digital input value substantially represents the analogue input signal when the DAC digital input value is a function of the analogue input signal, such as, for example, a linear function.

In certain embodiments, the analogue input signal is a differential input voltage, provided by, for example, a differential sample and hold circuit. The comparator may then perform the comparison by summing respective ones of the pairs of signals provided to the comparator, where the pairs of signals each comprise a differential signal. Preferably, the comparator compares the difference between the first and second differential output signals from the DAC with twice the differential input voltage. The comparator then indicates whether the DAC digital input value is too high or too low when compared with the differential input voltage. This indication (and, preferably, further indications) from the comparator may then be used to modify the DAC digital input value so that it substantially represents the analogue input signal.

In certain embodiments, an intermediate digital value, which is also modified by the controller such that it substantially represents the analogue input signal, is provided as an output from the analogue to digital converter. Preferably, the intermediate digital value is provided as the output from the analogue to digital converter when the intermediate digital value substantially represents the analogue input signal. Therefore, the intermediate digital value is not provided as the output whilst it is being modified.

In certain embodiments, the first input signal to the DAC comprises the DAC digital input value with the least significant bit discarded. In certain embodiments, the second input signal to the DAC comprises the two's complement of the DAC digital input value, while the least significant bit of the two's complement discarded. Thus, the difference between the first and second input signals to the DAC represents the DAC digital input value. The first and second inputs each have one fewer bit than the DAC digital input value. For example, if the DAC digital input value has n-bits (and the analogue to digital converter is a n-bit converter), then the first and second inputs to the DAC each have (n-1) bits. Within the DAC, each of the first and second inputs is used to derive two (n-2) bit words, using a method similar to that used to derive the first and second inputs to the DAC. So, for example, the first input is used to derive two words, which are the first input with the least significant bit discarded and the two's complement of the first input with the least significant bit of the two's complement discarded. Each of the four (n-2) bit words corresponds to a point along the resistor string in the DAC, and is used for controlling a switch to connect one of the outputs of the DAC to that point. The dual differential DAC may, therefore, have a (n-2) bit resistor string.

In alternative embodiments, the first and second input signals to the DAC and/or one or more of the four (n-2) bit words are derived using an alternative method. For example, two of the (n-2)-bit words within the DAC are derived from the first input signal to the DAC as follows. One of the words comprises the first input signal with the least significant bit discarded. The other word is derived by subtracting one from the first input signal, and discarding the least significant bit from the result. The resulting word is then treated as a negative two's complement value. The two words are then used as appropriate to connect the outputs of the DAC to points along the resistor string to produce the appropriate differential output voltage. The first and second input signals to the DAC and/or two (n-2) bit words derived from the second input to the DAC may additionally or alternatively be derived in this way.

In certain embodiments, the analogue to digital converter comprises an input sample and hold circuit for sampling the analogue input signal (which is, for example, a single-ended analogue voltage) and providing the sampled input voltage to the comparator. Thus, the analogue to digital converter is not affected by changes in the input voltage whilst the intermediate digital value is being modified such that it substantially represents a sample of the input voltage. Preferably, the sample and hold circuit is a differential sample and hold circuit, and the sample and hold circuit samples the analogue input signal and provides a differential sampled input voltage to the comparator. Preferably, the comparator compares the difference between the first and second differential outputs from the DAC with twice the differential input voltage.

Preferably, the DAC digital input value is a n-bit value. The first and second digital inputs to the DAC comprise (n-1)-bit values, and the DAC comprises a (n-2)-bit resistor string. A (n-2)-bit resistor string has considerably fewer resistors than a n-bit resistor string. For example, a n-bit resistor string has $(2^n-1)$ resistors, and a (n-2)-bit resistor string has $(2^{(n-2)}-1)$ resistors. Therefore, the n-bit resistor string has approximately four times as many resistors as the (n-2)-bit resistor string. Having fewer resistors has a number of benefits. For example, a (n-2)-bit DAC requires less chip area than a n-bit DAC if the DAC is implemented as an integrated circuit. Also, for example, the (n-2)-bit resistor string produces less output noise than the n-bit resistor string, as less resistors are used to produce the analogue outputs signals from the DAC. Furthermore, for example, charging of any capacitances at the output of the DAC (for example, parasitic capacitances or other circuit capacitances) is faster with a (n-2)-bit resistor string, as the speed of charging is governed by an RC function where the resistance (R) includes some or all of the resistors in the DAC resistor string.

In certain embodiments, the controller modifies the DAC digital input value using successive approximation such that the DAC digital input value substantially represents the analogue input signal.

In certain embodiments, the analogue to digital converter comprises the first and second output sample and hold circuits for sampling the first and second differential output signals from the DAC respectively when the analogue to digital converter is in a digital to analogue converter mode. The analogue to digital converter can, therefore, also be used as a digital to analogue converter, making use of the dual differential DAC.

In certain embodiments, the logic for deriving the first and second digital input signals for the DAC includes first and second digital inputs, and the logic passes the digital inputs to the DAC when the analogue to digital converter is in a digital to analogue converter mode. The outputs of the DAC are then used as outputs from the analogue to digital converter in digital to analogue converter mode.

According to a second aspect of embodiments of the invention, there is provided a method of analogue to digital conversion, comprising: providing a DAC digital input value to a dual differential digital to analogue converter (DAC), such that a difference between first and second differential output signals from the DAC substantially represents the DAC digital input value; comparing the output signals from the DAC with an analogue input signal; and modifying the DAC digital value in response to the comparison such that the DAC digital input value substantially represents the analogue input signal.

In certain embodiments, providing the analogue input signal to the comparator comprises sampling and holding the analogue input signal to obtain a sample input voltage, and providing the sampled input voltage the comparator.

In certain embodiments, the sampled input voltage provided to the comparator is a differential voltage.

In certain embodiments, the method comprises comparing the first and second differential output signals from the DAC with twice the differential sampled input voltage.

In certain embodiments, providing a DAC digital input value to the DAC comprises: providing the DAC digital input value, with the least significant bit discarded, to a first input of the DAC; and providing the two's complement of the DAC digital input value, with the least significant bit of the two's complement discarded, to a second input of the DAC.

In certain embodiments, modifying the DAC digital input value comprises using successive approximation to modify the DAC digital input value such that the DAC digital input value substantially represents the analogue input signal.

BRIEF DESCRIPTION OF THE DRAWINGS

Embodiments of the invention will now be described, by way of example only, with reference to the accompanying drawings, in which.

DETAILED DESCRIPTION OF EMBODIMENTS OF THE INVENTION

Figure 1:
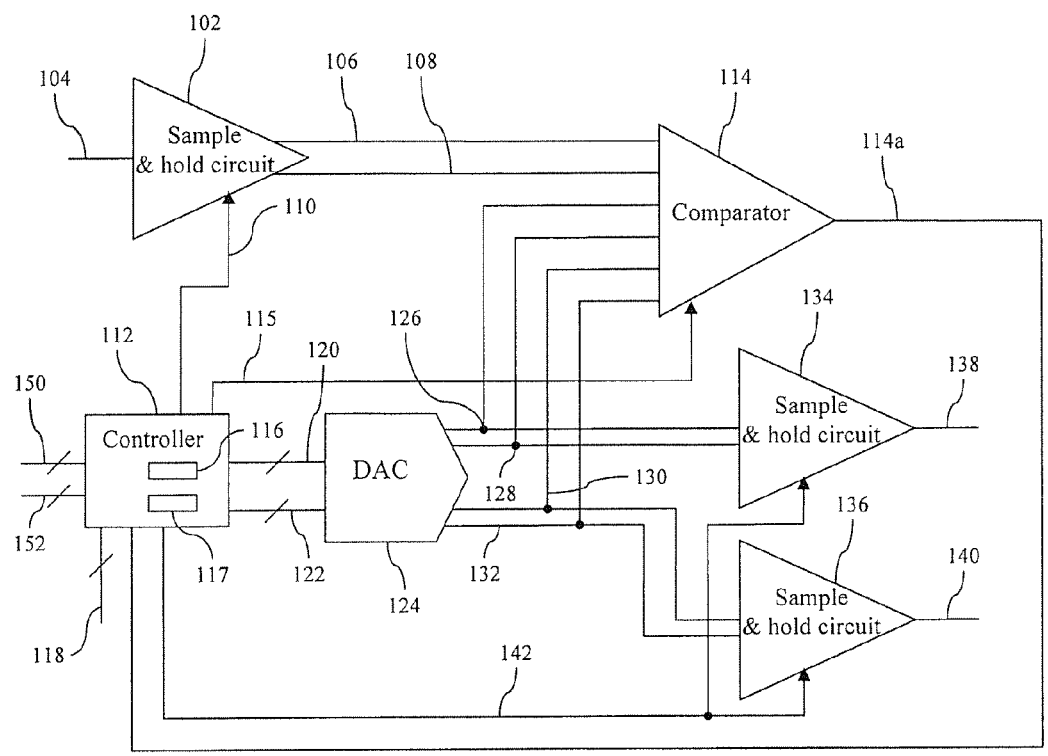
FIG. 1 shows an analogue to digital converter according to embodiments of the invention.

The analogue to digital converter (ADC) 100 of FIG. 1 comprises an input differential sample and hold circuit 102 which samples an input voltage 104 and produces a corresponding sampled differential voltage on differential outputs 106 and 108. The sample and hold circuit 102 is controlled by control signal 110 from controller 112, which is described in more detail later.

The outputs 106 and 108 from the input sample and hold circuit 102 are provided to a comparator 114. The output of the comparator 114 is provided to the controller 112. The controller 112 controls the comparator 114 using a control signal 115. The controller 112 includes storage 116 (such as, for example, a register) for storing an intermediate digital value (IDV). The controller 112 also includes storage 117 (such as, for example, a register) for storing a digital to analogue converter (DAC) input value. The controller 112 also includes a 12-bit digital output 118, which is the 12-bit digital output from the ADC 100. It should be noted, however, that alternative embodiments of the invention may comprise an ADC with an alternative number of output bits, with a different number of bits for features of the ADC (such as the DAC and the first and second digital input signals to the DAC) as appropriate.

The controller 112 provides first and second 11-bit digital values 120 and 122 to a dual differential digital to analogue converter (DAC) 124. The DAC 124 produces a first pair of differential output voltages 126 and 128 that represent the first digital value 120. Similarly, the DAC 124 produces a second pair of differential output voltages 130 and 132, which represent the second digital value 122. The differential voltage pairs 126, 128, 130 and 132 are provided to the comparator 114.

The first differential output 126 and 128 from the DAC 124 is provided to a first output sample and hold circuit 134. The second differential output 130 and 132 is provided to a second output sample and hold circuit 136. The output sample and hold circuits 134 and 136 can be used provide single ended output voltages 138 and 140 respectively, which represents the differential output voltages from the DAC 124. The output sample and hold circuits 134 and 136 are controlled by a control signal 142 from the controller 112.

The digital values 120 and 122 provided to the DAC 124 are derived from the DAC input value 117 as follows. The first digital value 120 comprises the 11 most significant bits (MSBs) of the 12-bit value 117. In other words, the least significant bit (LSB) of the value 117 is discarded to form the first digital value 120.

The second digital value 122 comprises the 11 MSBs of the two's complement (i.e. the digital negative) of the DAC input value 117. The two's complement of a digital value may be obtained, for example, by inverting all of the bits of the digital value and then adding one to the result. Therefore, an example method of deriving the second input 122 to the DAC 124 comprises inverting all of the bits of the DAC input value 117, adding one to the result, and discarding the LSB.

The difference between the first and second inputs 120 and 122 to the DAC 124, therefore, represents the DAC input value 117. It also follows that the difference between the differential outputs 126, 128, 130, 132 of the DAC 124 also represents the DAC input value 117.

The comparator 114 performs the following comparison on its inputs:

$$(IP-IN)-(QP-QN) > 2(Refp-Refm) \qquad (1)$$

where

IP is the output 126 from the DAC 124,

IN is the output 128 from the DAC 124,

QP is the output 130 from the DAC 124,

QN is the output 132 from the DAC 124,

Refp is the output 106 from the input sample and hold circuit 112, and

Refm is the output 108 from the input sample and hold circuit 112.

The comparator, therefore, compares the difference between the differential output signals from the DAC 124 with twice the differential voltage provided by the input sample and hold circuit 102.

The output 114a from the comparator is logic 1 (high) when the above comparison is true; otherwise, the output is logic 0 (low).

Figure 2:
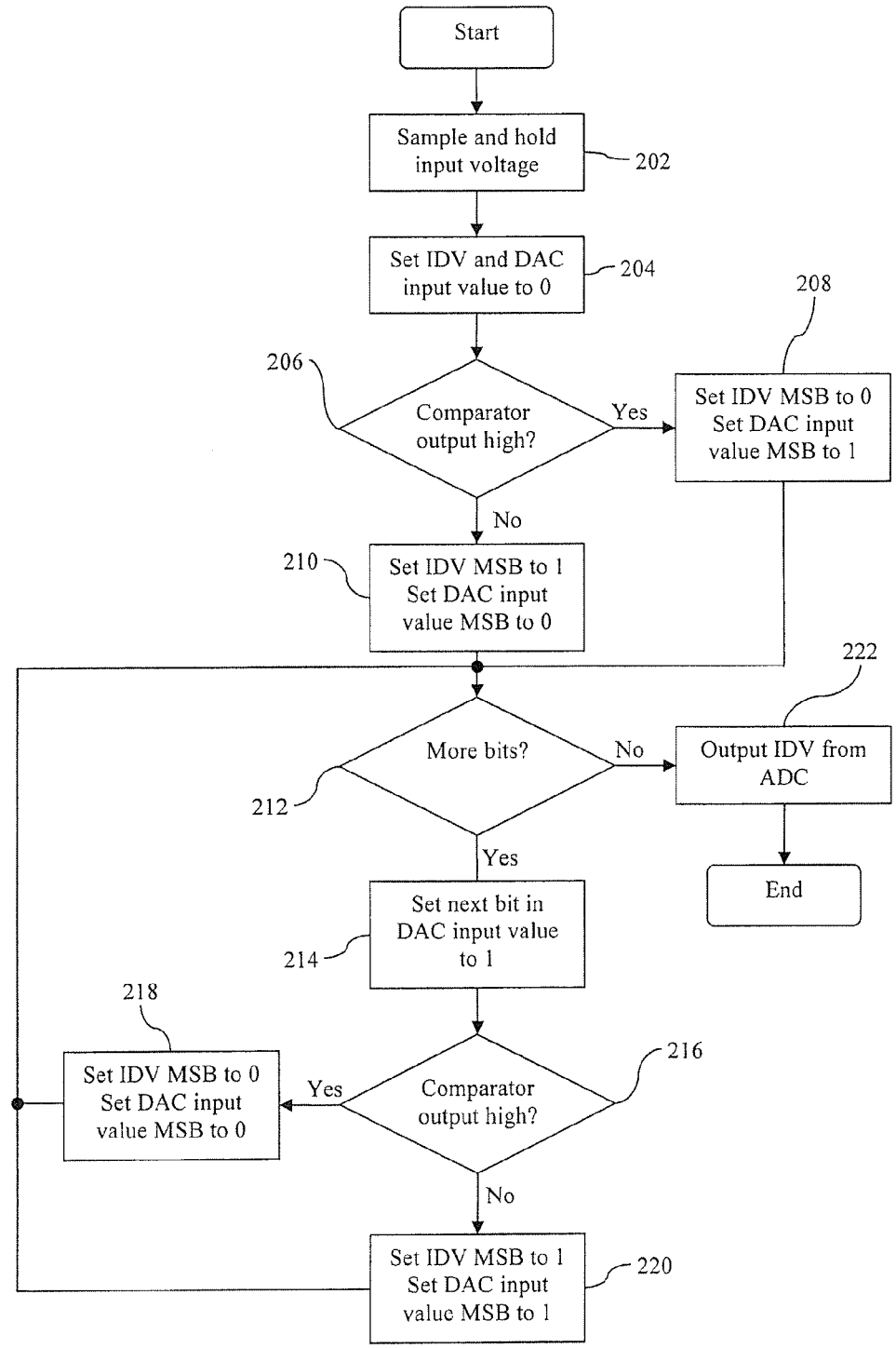
FIG. 2 shows an example of a method of analogue to digital conversion according to embodiments of the invention.

FIG. 2 shows a flow chart of an embodiment of a process carried out by the ADC 100 to convert an analogue voltage into a digital value. The process uses successive approximation.

In the first step 202, the controller 112 sends a control signal 110 to the input sample and hold circuit 102. The control signal 110 causes the sample and hold circuit 102 to sample the input voltage 104 and provide a corresponding differential voltage on the outputs 106 and 108 of the sample and hold circuit 102. The difference between the voltages on the outputs 106 and 108 therefore represents an instantaneous value of the input voltage 104. The sample and hold circuit 102 samples the input voltage 104 over a sampling period, and holds the output differential voltage at the end of the sample period. The conversion process then begins after a further period, a settling period, which in preferred embodiments is equal in duration to the sample period.

In step 204, which follows from step 202, the intermediate digital value 116 and DAC input value are set to 0, i.e. all of the bits of the values are set to 0. The inputs 120 and 122 to the DAC 124 are derived from the DAC input value 117. When the DAC input value 117 is 0, as is the case following step 204, the inputs 120 and 122 are also 0. Hence, both differential outputs from the DAC 124, i.e. the first pair of outputs 126 and 128 and the second pair of outputs 130 and 132, are zero, although the absolute voltages of the individual outputs (for example, the output 126) are not necessarily zero volts.

In step 206, which follows from step 204, the output of the comparator 114 is inspected. If the output is high (i.e. logic 1), then the difference between the differential voltages 126, 128, 130 and 132 from the DAC 124 is too high. Therefore, the process proceeds to step 208. In step 208, the MSB of the intermediate digital value 116 is set to 0, and the MSB of the DAC input value 117 is set to 1. The reason for the difference between the MSBs of the intermediate digital value 116 and the DAC input value 117 is that the intermediate digital value represents a positive or zero digital value, and the DAC input value is a two's complement digital value which may have a negative value.

If it is determined in step 206 that the output of the comparator 114 is low (i.e. logic 0), then the difference between the differential voltages 126, 128, 130 and 132 from the DAC 124 is too low. Therefore, the process proceeds to step 210. In step 210, the MSB of the intermediate digital value 116 is set to 1, and the MSB of the DAC input value 117 is set to 0.

The process proceeds from step 208 or step 210 to step 212. At this point, the MSBs of the intermediate digital value 116 and the DAC input value 117 have been processed. In step 212, a determination is made whether there are any more bits in the intermediate digital value 116 and the DAC input value 117 that have not been processed. If there are more bits, then the process continues at step 214, where the next most significant bit (i.e. the most significant unprocessed bit) in the DAC input value 117 is set to 1.

In step 216, which follows from step 214, the output of the comparator 114 is inspected. If the output is high, then the difference between the differential voltages 126, 128, 130 and 132 from the DAC 124 is too high. Therefore, the process proceeds to step 218. In step 218, the most significant unprocessed bit of the intermediate digital value 116 is set to 0, and the most significant unprocessed bit of the DAC input value 117 is set to 0. This reduces the DAC input value 117 as the most significant unprocessed bit had previously been set to 1 in step 214. Once the bits have been set accordingly in step 218, the process returns to step 212.

It if is determined in step 216 that the output of the comparator 114 is low, then the difference between the differential voltages 126, 128, 130 and 132 from the DAC 124 is too low. Therefore, the process proceeds to step 220. In this step, the most significant unprocessed bit of the intermediate digital value 116 is set to 1, and the most significant unprocessed bit of the DAC input value 117 is held at 1. Once the bits have been set accordingly in step 218, the process returns to step 212.

If it is determined in step 212 that there are no unprocessed bits, then the process continues from step 222. The intermediate digital value 116 at this point represents the sampled and held input voltage 104. In step 222, the ADC 100 provides the intermediate digital value 116 a the output 118 from the ADC 100. The conversion process is, therefore, complete, and the process ends after step 222.

The dual differential DAC 124 in the ADC 100 includes two 11-bit inputs 120 and 122, and includes a single 10-bit resistor string. The resistor string can give rise to differential outputs corresponding to both of the inputs 120 and 122. The ADC 100 provides a 12-bit output 118. The ADC 100 therefore includes a DAC with a resistor string a quarter of the size of a resistor string in a 128-bit string DAC with single-ended input and output. Other embodiments of the invention may contain other types of DAC. These include, for example, a segmented DAC, which may contain one or more string DACs. These also include, for example, other dual differential DACs that are not string DACs.

The ADC 100 of FIG. 1 performs the above analogue to digital conversion when in an analogue to digital conversion mode. The ADC can also operate in a digital to analogue conversion mode, as follows.

The controller 112 of the ADC 100 includes first and second 11-bit digital inputs 150 and 152. When a digital to analogue conversion is required, the controller 112 passes the inputs 150 and 152 to the inputs 120 and 122 of the DAC 124. The controller 112 may do this, for example, in response to an external event, such as, for example, a clock signal. The DAC 124 then performs the digital to analogue conversion on the inputs 120 and 122 to produce corresponding differential outputs 126, 128, 130 and 132.

After a time delay, such as, for example, a fixed time delay to allow the DAC 124 to perform the digital to analogue conversion, the controller 112 instructs the output sample and hold circuits 134 and 136 via the control signal 142 to sample and hold the differential outputs of the DAC 124. For example, the output sample and hold circuit 134 samples the first differential outputs 126 and 128 and produces a corresponding single-ended output voltage 138. The output sample and hold circuit 134 holds the voltage on the output 138 until it is next instructed by the controller 112 to sample and hold the outputs 126 and 128 from the DAC. Similarly, the output sample and hold circuit 136 samples the second differential outputs 130 and 132 and produces a corresponding single-ended output voltage 140.

Figure 3:
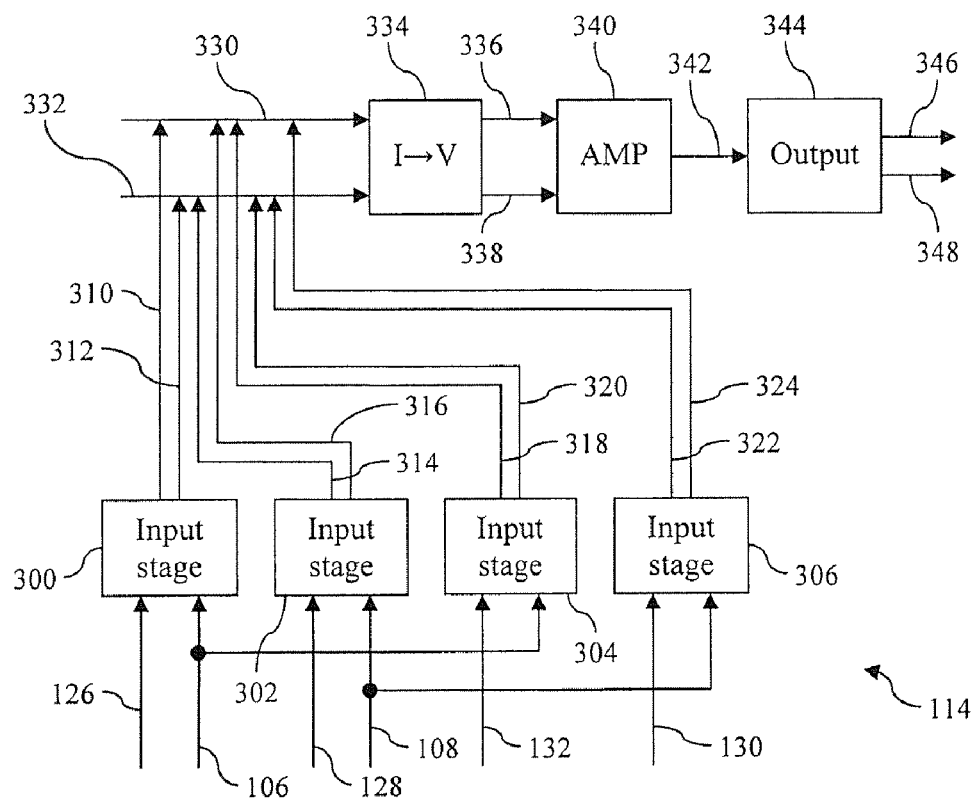
FIG. 3 schematically shows an embodiment of a comparator.

FIG. 3 shows the comparator 114 in more detail. The comparator comprises four input stages 300, 302, 304 and 306. The first input stage 300 is provided with the outputs 126 and 106 from the DAC 124, and produces output currents 310 and 312. The output currents 310 and 312 are produced as follows. The controller 112 controls the comparator 114 to be in an offset cancellation mode or a comparator mode. In the offset cancellation mode, both of the output currents 310 and 312 represent the output 126 from the comparator 124. In the comparator mode, the current 310 represents the output 126 from the DAC 124, whereas the current 312 represents the output 106 from the DAC 124.

The second input stage 302 is provided with the outputs 128 and 108 from the DAC 124, and produces output currents 314 and 316. In the offset cancellation mode, both of the output currents 314 and 316 represent the output 128 from the comparator 124. In the comparator mode, the current 314 represents the output 128 from the DAC 124, whereas the current 316 represents the output 108 from the DAC 124.

The third input stage 306 is provided with the outputs 132 and 106 from the DAC 124, and produces output currents 318 and 320. In the offset cancellation mode, both of the output currents 318 and 320 represent the output 132 from the comparator 124. In the comparator mode, the current 318 represents the output 132 from the DAC 124, whereas the current 320 represents the output 106 from the DAC 124.

The fourth input stage 308 is provided with the outputs 130 and 108 from the DAC 124, and produces output currents 322 and 324. In the offset cancellation mode, both of the output currents 322 and 324 represent the output 130 from the comparator 124. In the comparator mode, the current 322 represents the output 130 from the DAC 124, whereas the current 324 represents the output 108 from the DAC 124.

The currents 310, 312, 314, 316, 318, 320, 322 and 324 are provided to a current summing node 330. The current summer 330 combines the currents, preferably by summing.

The currents 310, 316, 318 and 324 are provided to a first current summing node 330. Therefore, when the comparator 114 is in the offset cancelling mode, the first current summing node 330 sums currents 310, 316, 318 and 324 representing the inputs 126, 128, 132 and 130 respectively. Therefore, the node 330 carries a current representing the function IP+IN÷QP+QN, which is substantially zero. When the comparator is in the comparator mode, the node 330 sums currents 310, 316, 318 and 324 representing the inputs 126, 108, 132 and 108 respectively. Therefore, the node 330 carries a current representing the function IP+QN+2Refm.

The currents 312, 314, 320 and 322 are provided to a second current summing node 332. Therefore, when the comparator 114 is in the offset cancelling mode, the first current summing node 330 sums currents 312, 314, 320 and 322 representing the inputs 126, 128, 132 and 130 respectively. Therefore, the node 322 carries a current representing the function IP+IN+QP+QN, which is substantially zero. When the comparator is in the comparator mode, the node 330 sums currents 312, 314, 320 and 322 representing the inputs 106, 128, 106 and 130 respectively. Therefore, the node 332 carries a current representing the function IN+QP+2Refp.

The currents 330 and 332 are provided to a converter 334 that converts the currents 330 and 332 to voltages 336 and 338 respectively, according to a substantially linear function. The voltages 336 and 338 are provided to a high gain amplifier 340 that amplifies the difference between the voltages 336 and 338. The amplified voltage is used to control a transistor such that the output 342 from the amplifier 340 is connected to either a first power supply voltage (Vdd) or a second power supply voltage (Vss). The output 342 from the amplifier 340 is, therefore, a digital signal representing the difference between the voltages 336 and 338. The output 342 represents the following function:

$$(IP+QN+2Refm)>(IN+QP+2Refp) \quad (2)$$

Equation 2 can be rearranged to form equation (1) above.

The digital signal 342 is provided to an output stage 344. When the comparator 114 is in the offset cancelling mode, digital outputs 346 and 348 from the output stage 344 do not carry a signal. When the comparator 114 is in the comparator mode, the output 346 is identical to the output 342 from the amplifier 340, and the output 348 is complementary to the output 346. The output 346 comprises the output from the comparator as shown in FIG. 1. The output 348 is unused in embodiments of the invention, although they may be used in other embodiments.

Figure 4:
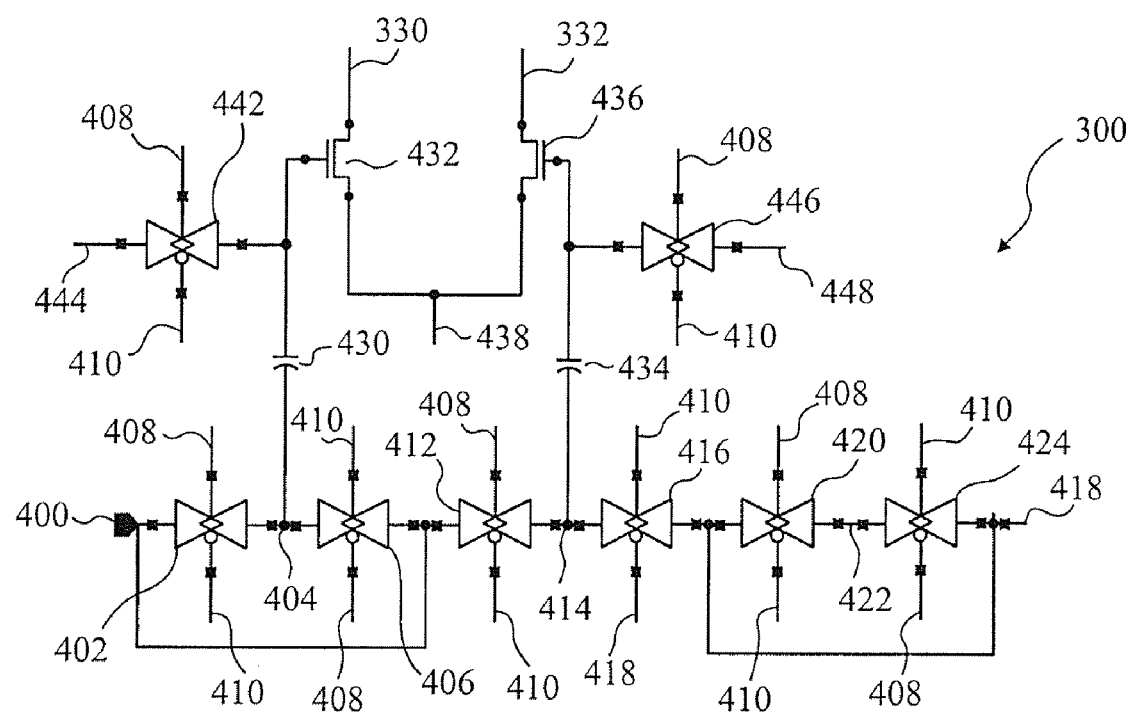
FIG. 4 shows part of the embodiment of a comparator.

FIG. 4 shows the input stage 300 in more detail. The input stages 302, 304 and 306 are identical and are, therefore, not shown for clarity.

The input stage 300 comprises a first input 400 that is connected to the output 126 from the DAC 124 shown in FIG. 1. A transmission gate 402 is connected between the input 400 and a node 404. A second transmission gate 406 is also connected between the input 400 and the node 404.

The transmission gate 402 is supplied with complementary signals 408 and 410. The signals 408 and 410 represent a strobe input (not shown) to the comparator 114. When the strobe input is high, the comparator is in an offset cancelling state, explained more fully below. When the strobe input changes to low, the comparator 114 performs a comparator function on the inputs. The signal 408 corresponds to the strobe input, and the signal 410 corresponds to the inverted strobe input.

The transmission gate 402 is arranged (connected to the signals 408 and 410) such that it acts as an open circuit when the strobe input is low, and a short circuit when the strobe input is high. Herein, this transmission gate 402 and other transmission gates similarly arranged are referred to as S1 type switches. The transmission gate 406 is arranged such that it acts as a closed circuit when the strobe input is low, and an open circuit when the strobe input is high. Herein, this transmission gate 406 and other transmission gates similarly arranged are referred to as S2 type switches.

A S1 type transmission gate 412 is connected between the input 800 and a circuit node 414. A S2 type transmission gate 416 is connected between the circuit node 414 and a second input 418 to the comparator 114. The input 418 is connected to the output 106 from the input sample and hold circuit 102 shown in FIG. 1. A S1 type transmission gate 420 is connected between the input 418 and a circuit node 422. A S2 type transmission gate 424 is connected between the circuit node 422 and the input 418.

A capacitor 430 is connected between the circuit node 404 and the gate of a n-channel field effect transistor (FET) 432. A capacitor 434 is connected between the circuit node 414 and the gate of a n-channel FET 436. The drain of the FET 432 is connected to the first current summing node 330 shown in FIG. 3, whilst the drain of the FET 436 is connected to the second current summing node 332. The sources of the FETs 432 and 436 are connected to a circuit node 438, which is used to provide a bias current to the FETs 432 and 436.

A S1 type transmission gate 422 is connected between the gate of the FET 432 and a circuit node 444. Similarly, a S1 type transmission gate 446 is converted between the gate of the FET 436 and a circuit node 448.

When the strobe input to the comparator 114 is high, the comparator 114 is in the offset cancelling mode. The S1 type transmission gates are effectively short circuits and the S2 type transmission gates are effectively open circuits. As a result, the input 400 to the input stage 300 will be connected to both of the capacitors 430 and 434. The gate of the FET 432 will be connected via the node 444 to corresponding FETs in the other input stages 302, 304 and 306 shown in FIG. 3. Similarly, the gate of the FET 436 will be connected via the node 448 to corresponding FETs in the other input stages 302, 304 and 306. The gates of the FETs 432 and 436 will be connected to a common voltage, which is provided to the input 400, via the respective capacitor 430 and 434. Any offset is stored across one or both of the capacitors 430 and 434.

When the strobe input to the comparator changes to low, the signal 308 changes to low and the signal 310 changes to high. The S1 type transmission gates are then effectively open circuits and the S2 transmission gates are effectively short circuits. In the input stage 300, the input 400 (IP) is connected to the capacitor 430, and the input 418 (Refp) is connected to the capacitor 434. The currents through the FETs 432 and 436 therefore represent the voltages provided to the inputs 400 and 418 respectively.

Figure 5:
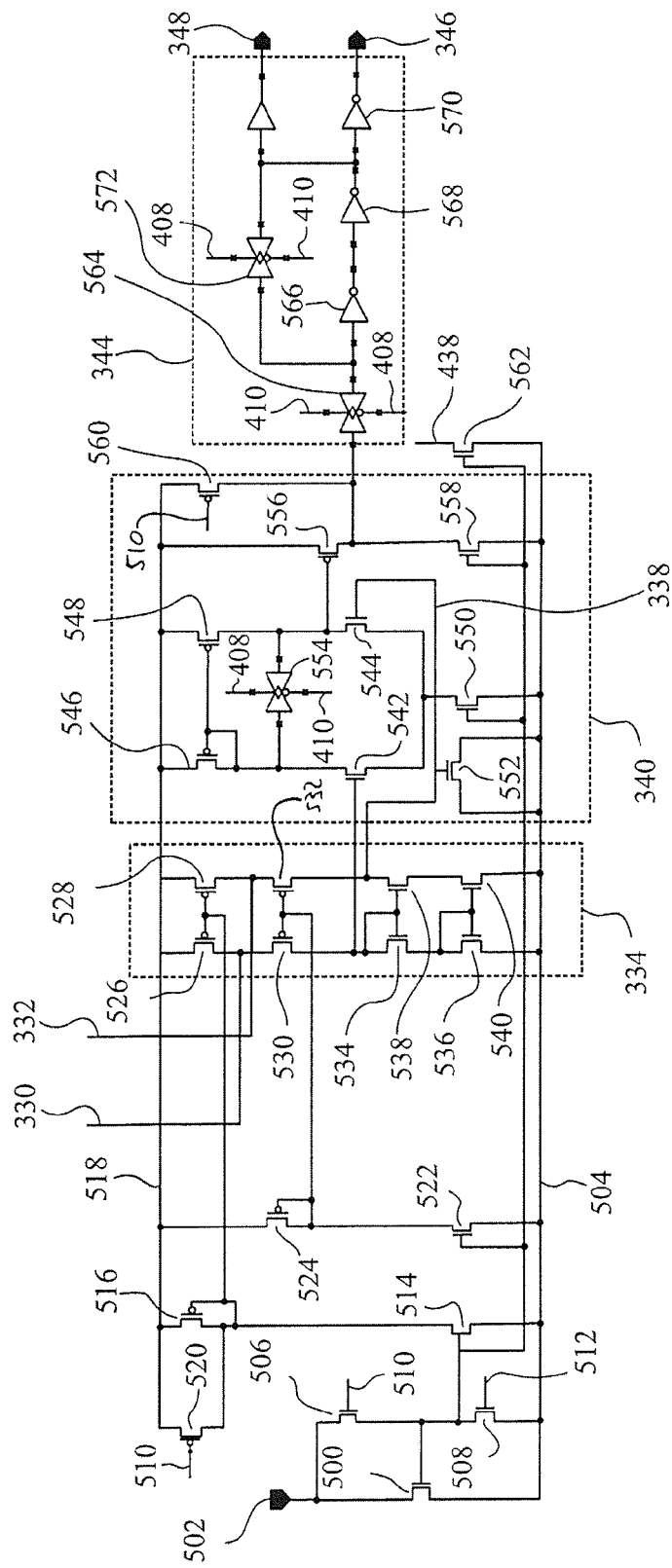
FIG. 5 shows part of the embodiment of a comparator.

FIG. 5 shows the converter 334, amplifier 340 and output stage 344 of the comparator 114 in more detail. The drain of a n-channel FET 500 is connected to a bias current input 502 to the comparator 114. The source of the FET 500 is connected to a Vss power supply voltage 504. The bias current input 502 to the comparator 114 is also connected to the drain of a n-channel FET 506. A bias current (such as, for example, 2 μA) is supplied to the comparator 114 via the bias current input 502. The source of the FET 506 is connected to the gate of the FET 500, and is also connected to the drain of a n-channel FET 508. The source of the FET 508 is connected to the Vss power supply voltage 504.

The gate of the FET 506 is connected to a signal 510 corresponding to an enable input to the comparator 114. The gate of the FET 508 is connected to a signal 512 which is complementary to the signal 510. The enable input is used to enable the comparator 114 such that, when the enable input is high, the comparator may perform its functions, and when the enable input is low, the comparator is effectively switched off and consumes less power than when the enable input is high.

The FETs 500, 506 and 508 are connected in such a way that when the enable input to the comparator 114 is high, the FET 500 acts as part of a current mirror. The gate of the FET 350 is connected to the gate of other transistors, which are used to provide bias currents to other parts of the comparator 114, including, for example, the input stages 300, 302, 304 and 306.

The gate of the FET 500 is connected to the gate of a n-channel FET 514. The source of the FET 514 is connected to the Vss power supply voltage 504. The drain of the FET 514 is connected to the drain of a p-channel FET 516. The source of the FET 516 is connected to a Vdd power supply voltage 518. The source of a p-channel FET 520 is connected to the Vdd power supply voltage 518, and the drain of the FET 520 is connected to the drain of the FET 516. The gate of the FET 520 is connected to the signal 510 representing the enable input to the comparator 114. Thus, when the enable input is low, the FET 520 effectively forms a short circuit between the source and drain of the FET 516.

The gate of the FET 500 is connected to the gate of a n-channel FET 522. The source of the FET 522 is connected to the Vss power supply voltage 504. The drain of the FET 522 is connected to the drain and gate of a p-channel FET 524. The source of the FET 524 is connected to the Vdd power supply voltage 518.

The gate of the FET 516 is connected to the gates of two p-channel FETs 526 and 528 within the converter 334. The sources of the FETs 526 and 528 are connected to the Vdd power supply voltage 518. The drain of the FET 526 is connected to the source of a p-channel FET 530. The drain of the FET 528 is connected to the source of a p-channel FET 532. The gates of the FETs 530 and 532 are connected to the gate of the FET 524.

The drain of the FET 530 is connected to the gate and drain of a n-channel FET 534. The source of the FET 534 is connected to the gate and drain of a n-channel FET 536. The source of the FET 536 is connected to the Vss power supply voltage 504.

The drain of the FET 532 is connected to the drain of a n-channel FET 538. The gate of the FET is connected to the gate of the FET 534. The source of the FET 538 is connected to the drain of a n-channel FET 540. The gate of the FET 540 is connected to the gate of the FET 536. The source of the FET 540 is connected to the Vss power supply voltage 504.

The first current summing node 330 is connected to the drain of the FET 526 and the source of the FET 530. The second current summing node 332 is connected to the drain of the FET 528 and the source of the FET 532.

The output 336 of the converter 334, at the drain of the FET 534, is connected to the gate of a n-channel FET 542 in the amplifier 340. The output 338 of the converter 334, at the drain of the FET 538, is connected to the gate of a n-channel FET 544 in the amplifier 340. The drain of the FET 542 is connected to the gate and drain of a p-channel FET 546. The drain of the FET 544 is connected to the drain of a p-channel FET 548. The gate of the FET 548 is connected to the gate of the FET 546. The sources of the FETs 546 and 548 are connected to the Vdd power supply voltage 518.

The sources of the FETs 542 and 544 are connected to the drain of a n-channel FET 550. The source of the FET 550 is connected to the Vss power supply voltage 504. The gate of the FET 550 is connected to the gate of the FET 500. Therefore, the FETs 500 and 550 form a current mirror that provides bias current to the amplifier 340.

The gate of the FET 544 is also connected to the gate of a n-channel FET 522. The source and drain of the FET 552 are connected to the Vss power supply voltage 504. The gate of the FET 542 is also connected to the node 44 shown in FIG. 4. Similarly, the gate of the FET 544 is also connected to the node 448.

A S1 type transmission gate 544 is connected between the drains of the FETs 394 and 396. In the offset cancelling mode, the drains of the FETs 542 and 546 are connected to the drains of the FETs 544 and 548. In the comparator mode, the transmission gate 554 is effectively an open circuit.

The drains of the FETs 548 and 544 are connected to the gate of a p-channel FET 556. The source of the FET 556 is connected to the Vdd power supply voltage 518. The drain of the FET 556 is connected to the drain of a n-channel FET 558. The source of the FET 558 is connected to the Vss power supply voltage 504. The gate of the FET 558 is connected to the gate to the FET 500.

The drain of the FET 556 is connected to the drain of a p-channel FET 560. The source of the FET 560 is connected to the Vdd power supply voltage 518. The gate of the FET 560 is connected to the signal 510 representing the enable input to the comparator 114.

The gates of a n-channel FET 562 is connected to the gate of the FET 500. The sources of the FET 562 is connected to the Vss power supply voltage 504. The drain of the FET 562 is connected to the node 438 of the input stage 300 shown in FIG. 4. The FET 562 therefore provides bias current to the input stage 300. Three further FETs (not shown) are similarly connected to provide bias current to the input stages 302, 304 and 306 respectively.

A S2 type transmission gate 564 in the output stage 314 is connected between the output 342 of the amplifier 340 (at the drain of the FET 556) and the input to a logic inverter 566. The output of the inverter 566 is connected to the input of an inverter 568. The output of the inverter 568 is connected to the input of an inverter 570. The output of the inverter 570 comprises the output 346 from the comparator 114. The output 346 is connected to the controller 112 as shown in FIG. 1.

A S1 type transmission gate 572 is connected between the input of the comparator 566 and the output of the inverter 568. The output of the inverter 568 is also connected to input of a buffer 574. The output of the buffer 574 comprises the output 348 of the amplifier 344, and represents a complementary output to the output 346.

The output 346 from the comparator 114 is high if the comparison in equation (1) above is true, and low otherwise. The output 346 is provided to the controller 112 as shown in FIG. 1.

Figure 6:
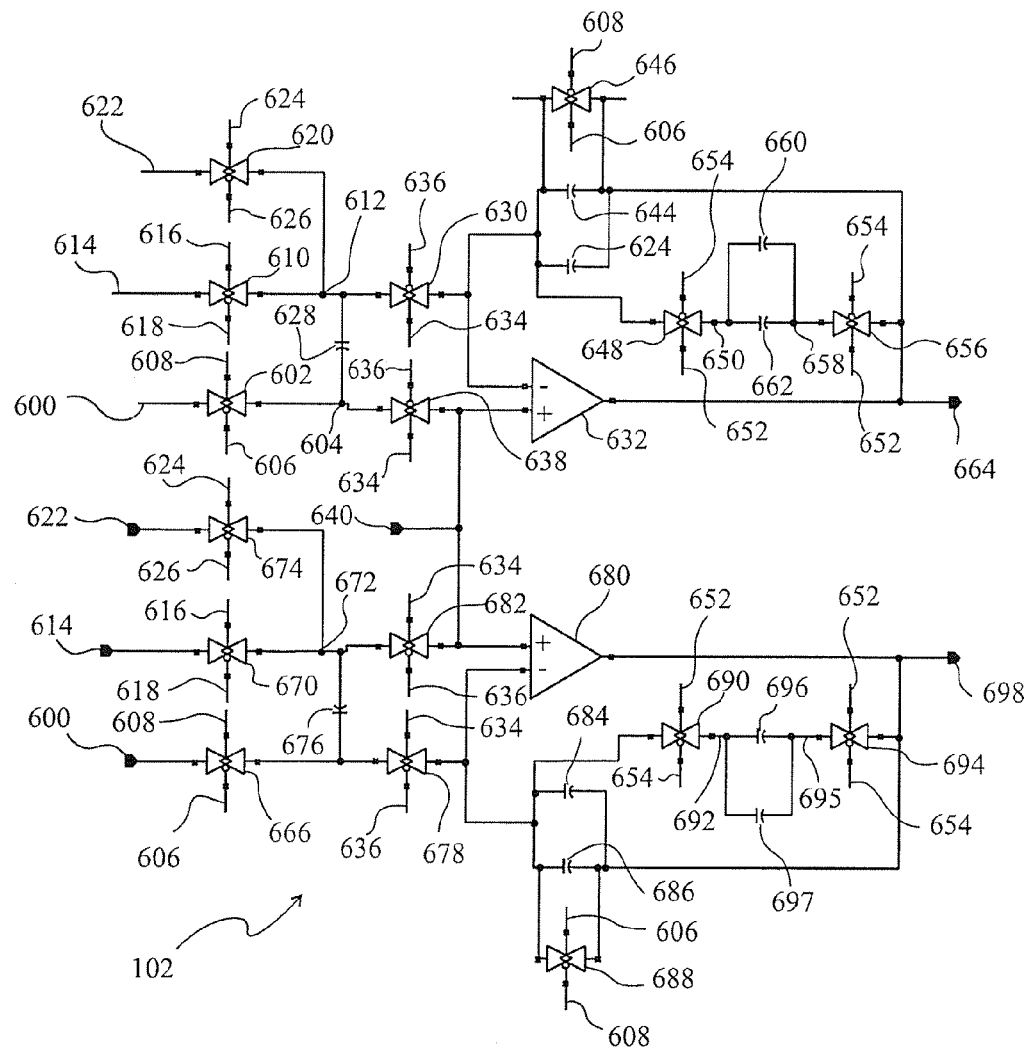
FIG. 6 shows part of an embodiment of an input sample and hold circuit.

FIG. 6 shows a part of the input sample and hold circuit 102 in more detail. The circuit 102 includes an input 600 that is connected to the input 104 shown in FIG. 1. A transmission gate 602 is connected between the input 600 and a node 604. The transmission gate 602 is supplied with complementary signals 606 and 608, such that the transmission gate 602 is essentially a short circuit when the signal 606 is high (and the signal 608 is low), and an open circuit when the signal 606 is low (and the signal 608 is high). The transmission gate 602, and any other transmission gates supplied with the signals 606 and 608 in this manner, are referred to herein as S3 type transmission gates.

A transmission gate 610 is connected between a node 612 and a half reference voltage 614. The transmission gate 610 is supplied with complementary signals 616 and 618, such that the transmission gate 610 is essentially a short circuit when the signal 616 is high (and the signal 618 is low), and an open circuit when the signal 616 is low (and the signal 618 is high). The transmission gate 610, and any other transmission gates supplied with the signals 616 and 618 in this manner, are referred to herein as S4 type transmission gates.

A transmission gate 620 is connected between the node 612 and a reference voltage 622. The transmission gate 620 is supplied with complementary signals 624 and 626, such that the transmission gate 620 is essentially a short circuit when the signal 624 is high (and the signal 626 is low), and an open circuit when the signal 624 is low (and the signal 626 is high). The transmission gate 620, and any other transmission gates supplied with the signals 624 and 626 in this manner, are referred to herein as S5 type transmission gates.

A capacitor 628 is connected between the nodes 604 and 612.

A transmission gate 630 is connected between the node 612 and the inverting input of an op-amp 632. The transmission gate 630 is supplied with complementary signals 634 and 636, such that the transmission gate 630 is essentially a short circuit when the signal 634 is high (and the signal 636 is low), and an open circuit when the signal 634 is low (and the signal 636 is high). The transmission gate 630, and any other transmission gates supplied with the signals 634 and 636 is this manner, are referred to herein as S6 type transmission gates.

A S6 type transmission gate 638 is connected between the node 604 and the non-inverting input of the op-amp 632. A common mode voltage 640 is also connected to the non-inverting input of the op-amp 632. Two capacitors 642 and 644 are connected in parallel between the inverting input and the output of the op-amp 632. A S3 type transmission gate 646 is also connected between the inverting input and the output of the op-amp 632.

A transmission gate 648 is connected between the inverting input of the op-amp 632 and a node 650. The transmission ate 648 is supplied with complementary signals 652 and 654, such that the transmission gate 648 is essentially a short circuit when the signal 652 is high (and the signal 654 is low), and an open circuit when the signal 652 is low (and the signal 654 is high). The transmission gate 648, and any other transmission gates supplied with the signals 652 and 654 in this manner, are referred to herein as S7 type transmission gates.

A S7 type transmission gate 656 is connected between the output of the op-amp 632 and a node 658. Two capacitors 660 and 662 are connected in parallel between the nodes 650 and 658. The transmission gates 648 and 656 can be used to switch the capacitors 660 and 662 in and out of the feedback path of the op-amp 632.

The output of the op-amp 632 also forms an output 664 from the input sample and hold circuit 102. The output 664 is connected to the output 106 shown in FIG. 1.

A S3 type transmission gate 666 is connected between the input 600 and a node 668. A S4 type transmission gate 670 is connected between a node 672 and the half reference voltage 614. A S5 type transmission gate 674 is connected between the node 672 and the reference voltage 622. A capacitor 676 is connected between the nodes 668 and 672.

A S6 type transmission gate 678 is connected between the node 668 and the inverting input of an op-amp 680. A S6 type transmission gate 682 is connected between the node 672 and the non-inverting input of the op-amp 680. The common mode voltage 640 is also connected to the non-inverting input of the op-amp 680. Two capacitors 684 and 686 are connected in parallel between the inverting input and the output of the op-amp 680. A S3 type transmission gate 688 is also connected between the inverting input and the output of the op-amp 680.

A S7 transmission gate 690 is connected between the inverting input of the op-amp 680 and a node 692. A S7 type transmission gate 694 is connected between the output of the op-amp 680 and a node 695. Two capacitors 696 and 697 are connected in parallel between the nodes 692 and 695.

The output of the op-amp 680 also forms an output 698 from the input sample and hold circuit 102. The output 698 is connected to the output 108 shown in FIG. 1.

Figure 7:
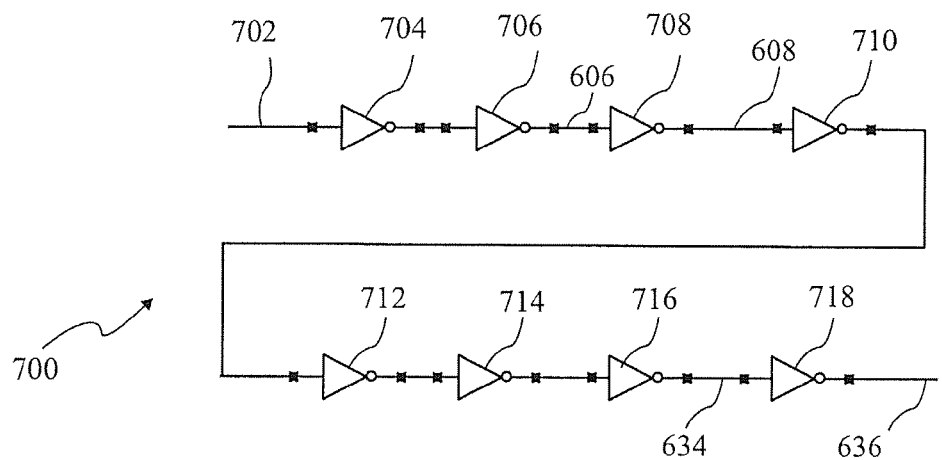
FIG. 7 shows part of an embodiment of an input sample and hold circuit.

FIG. 7 shows a circuit 700 included in the input sample and hold circuit 102 for generating the signals 606 and 608 (supplied to the S3 type transmission gates) and 634 and 636 (supplied to the S6 type transmission gates). The circuit 700 includes a strobe input 702 to the input sample and hold circuit 102. The strobe input may be the same strobe input provided to the comparator 114, or may be a different strobe input. The strobe input is provided to the controller via the control signal 110 shown in FIG. 1. The strobe input is provided to the input of two series-connected inverters 704 and 706. The output of the inverter 706 comprises the signal 606. The signal 606 is provided to the input of an inverter 708. The output of the inverter 708 comprises the signal 608. The signal 608 is provided to four series-connected inverters 710, 712, 714 and 716. The output of the inverter 716 comprises the signal 634. The signal 634 is provided to the input of an inverter 718. The output of the inverter 718 comprises the signal 636.

The signals 606 and 636 are, therefore, generally at the same logic level. The signals 608 and 634 are generally at the same logic level. However, when the strobe input changes, for example from logic high to logic low or from logic low to logic high, the signals 634 and 636 change a short delay after the signals 606 and 608 change, due to the propagation delay introduced by the inverters 710, 712, 714, 716 and 718. The additional propagation delay ensures that, for example, the input 700 and the capacitor 728 are not simultaneously connected to the non-inverting input of the op-amp 732.

Figure 8:
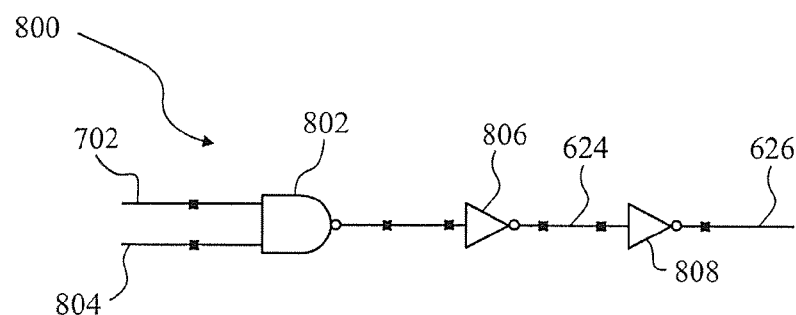
FIG. 8 shows part of an embodiment of an input sample and hold circuit.

FIG. 8 shows a circuit 800 included in the sample and hold circuit 102 for generating the signals 624 and 626, which are supplied to the S5 type transmission gates. The circuit 800 includes a NAND gate 802. The inputs to the NAND gate 802 comprise the strobe input 702 and a gain input 804. The gain input is provided to the input sample and hold circuit 102 and is used to specify whether the input signal 104 provided to the input sample and hold circuit 102 has a range 0–Vref or 0–2*Vref, where Vref is the reference voltage provided to the input 622 to the circuit 102 shown in FIG. 6. When the gain input 804 is high, the larger input range of 0–2*Vref is selected. If the gain input is low, the smaller input range of 0–Vref is selected. In an example embodiment, Vref is chosen to be 1.2 V, and the half reference voltage provided to the input 614 is chosen to be 0.6 V.

The output of the NAND gate 802 is provided to the input of an inverter 806. The output of the inverter 806 forms the signal 624. The signal 624 is provided to the input of an inverter 808. The output of the inverter 808 forms the signal 626.

Figure 9:
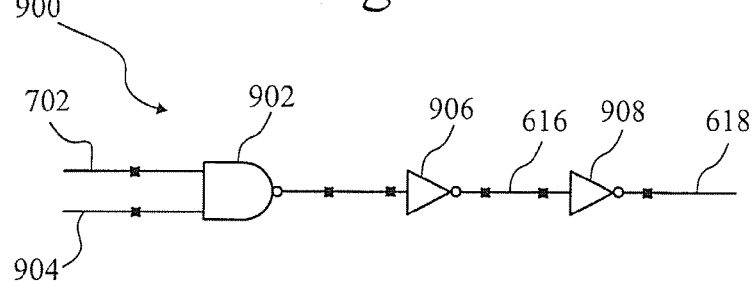
FIG. 9 shows part of an embodiment of an input sample and hold circuit.

FIG. 9 shows a circuit 900 included in the sample and hold circuit 102 for generating the signals 616 and 618, which are supplied to the S4 type transmission gates. The circuit 900 includes a NAND gate 902. The inputs to the NAND gate 902 comprise the strobe input 702 and a signal 904. The signal 904 is complementary to the gain input 804, and is effectively an inverted version of the gain input 804.

The output of the NAND gate 902 is provided to the input of an inverter 906. The output of the inverter 906 forms the signal 616. The signal 616 is provided to the input of an inverter 908. The output of the inverter 908 forms the signal 618.

An example of the operation of the input sample and hold circuit 102 will now be described with reference to FIG. 6. In the example, the gain input is high, indicating that the expected range of the input 600 to the circuit 102 is 0–2*Vref. The S4 type transmission gates are, therefore, effectively open circuits, and the S7 type transmission gates are effectively closed circuits.

When the strobe input to the circuit 102 changes to high, the S3 and S5 type transmission gates become effectively closed circuits, and the S6 type transmission gates become effectively open circuits. The capacitors 628 and 676 are connected between the input voltage 600 and the reference voltage Vref 622. The S6 type transmission gates 630, 638, 678 and 682 isolate the capacitors 628 and 676 from the inputs of the op-amps 632 and 680.

When the strobe input changes to low, the S3 and S5 type transmission gates become effectively open circuits, leaving a sampled voltage across each of the capacitors 628 and 676. The S6 type transmission gates then effectively become closed circuits, connecting the capacitors 628 and 676 across the inputs of the respective op-amp. For example, the transmission gates 630 and 638 become effectively closed circuits, and the capacitor 628 is connected across the inverting and non-inverting inputs of the op-amp 632.

The voltage of the non-inverting input of the op-amp 632 is held at the common mode voltage 640. In the example embodiment, the common mode voltage is chosen to be 0.375 V. The feedback loop and the operation of the op-amp 632 also cause the inverting input to be held at the common mode voltage. As a result, the charge in the capacitor 628 is redistributed in the capacitors 642, 644, 660 and 662. The output voltage 664 is, therefore, defined in the following equation:

$$V\text{outp}=V\text{common}+((IP-V\text{ref})/4) \qquad (3)$$

where:
Voutp is the output voltage 664,
Vcommon is the common mode voltage 640,
IP is the input voltage 600, and
Vref is the reference voltage 622.

The dividing factor of 4 in equation (3) above arises because the feedback capacitance in the feedback loop of the op-amp 632 (comprising capacitors 642, 644, 660 and 662) is four times greater than that of capacitor 628.

Using similar analysis in respect to the op-amp 680, it can be shown that:

$$V\text{outn}=V\text{common}+((V\text{ref}-IP)/4) \qquad (4)$$

where:
Voutn is the output voltage 698,
Vcommon is the common mode voltage 640,
IP is the input voltage 600, and
Vref is the reference voltage 622.

The voltages Voutp and Voutn (provided on outputs 664 and 698 respectively) therefore comprise a differential voltage with a common mode voltage Vcommon.

If the gain input is low, indicating that the expected range of the input signal 600 is 0–Vref, the S7 type transmission gates are effectively open circuits. Therefore, the capacitors 660, 662, 696 and 697 are not part of the feedback loops of the op-amps 632 and 680. The S5 type transmission gates are effectively open circuits. Therefore, when the strobe input is high, the capacitors 628 and 676 are connected between the input voltage 600 and the half reference voltage 614. In the example embodiment described, the half reference voltage 614 is chosen to be 0.6 V, i.e. Vref/2. A similar analysis to that above provides the following equation:

$$V\text{outp}=V\text{common}+((IP-V\text{ref}/2)/2) \qquad (5)$$

$$V\text{outn}=V\text{common}+((V\text{ref}/2-IP)/2) \qquad (6)$$

It can therefore be seen that when the gain input is high, and the input voltage has a range of 0–2*Vref, then the differential output voltage (comprising the voltages Voutp and Voutn) has a range of ±Vref/2 and a common node voltage Vcommon. Furthermore, when the gain input is low, and the input voltage has a range of 0–Vref, then the differential output voltage again has a range of ±Vref/2 and a common mode voltage Vcommon.

In an example embodiment of the invention, Vref is chosen to be 1.2 V, and the common mode voltage is 0.375 V. Therefore, each of the voltages Voutp and Voutn has a range of 0.075 V–0.675 V, and the differential output voltage from the circuit 102 has a range ±0.6 V, i.e. a total voltage swing of 1.2 V. The resistor string (not shown) of the dual differential DAC 124, in an example embodiment of the invention, is connected between the voltages 0.675 V and 0.075 V. Therefore, the output differential range, voltage swing and common mode voltage of the DAC 124 matches those of the input sample and hold circuit 102.

Figure 10:
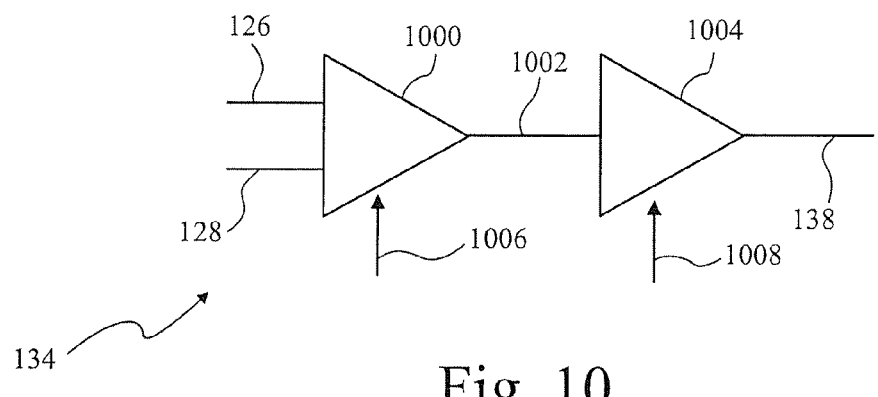
FIG. 10 shows an embodiment of an output sample and hold circuit.

FIG. 10 shows the output sample and hold circuit 134 in more detail, although the output sample and hold circuit 136 is identical in construction. The circuit 134 includes a differential sample and hold circuit 1000, which samples the input differential voltage (comprising signals 126 and 128) and provide a sampled single-ended output 102. An output hold circuit 1004 samples the single-ended signal 1002 and provides an output 138. The circuits 1000 and 1004 are controlled by the controller 112 shown in FIG. 1, via the control signal 142. The control signal 142 contains a control signal 1006, which is provided to the differential sample and hold circuit 1000. The control signal 142 also contains a control signal 1008, which is provided to the single-ended sample and hold circuit 1004.

Figure 11:
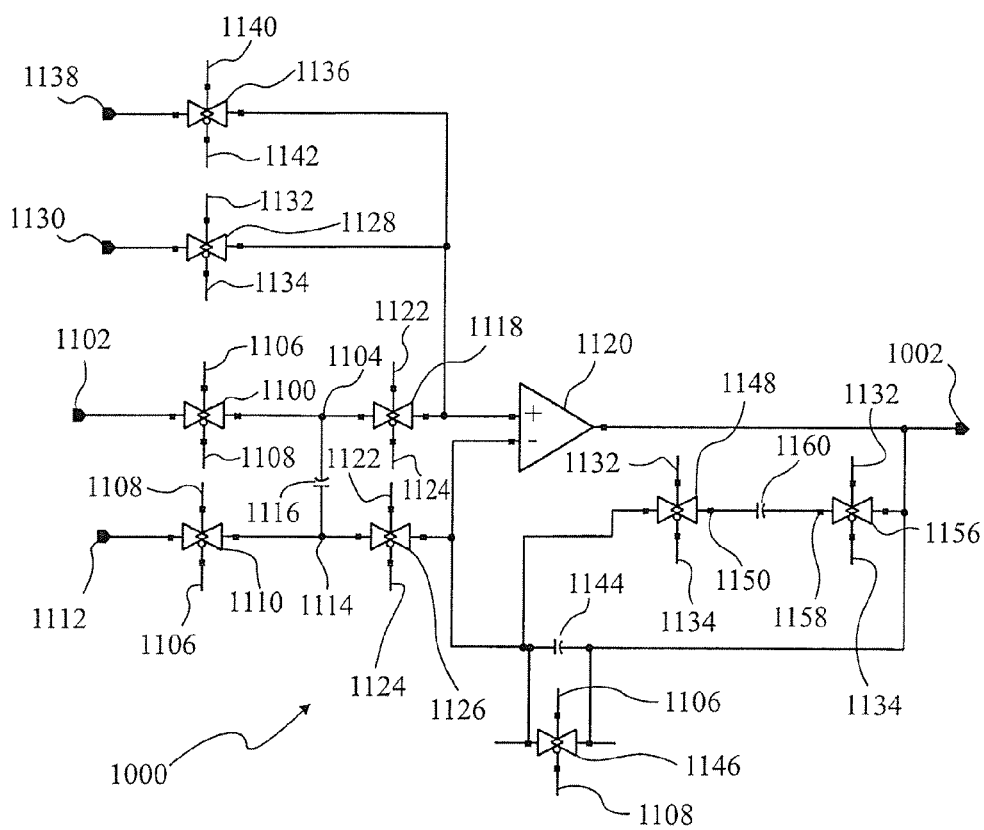
FIG. 11 shows part of an embodiment of a differential sample and hold circuit.

FIG. 11 shows part of the differential sample and hold circuit 1000 in more detail. The circuit 1000 includes a transmission gate 1100 that is connected between an input 1102 and a node 1104. The input 1102 is connected to the output 126 from the DAC 124 shown in FIG. 1. The transmission gate 1100 is supplied with complementary signals 1106 and 1108, such tat the transmission gate 1100 is essentially a short circuit when the signal 1106 is high (and the signal 1108 is low), and an open circuit when the signal 1106 is low (and the signal 1108 is high). The transmission gate 1100, and any other transmission gates supplied with the signals 1106 and 1108 in this manner, are referred to herein as S8 type transmission gates.

A S8 type transmission gate 1110 is connected between an input 1112 and a node 1114. The input 1112 is connected to the output 128 of the DAC 124 shown in FIG. 1. A capacitor 1116 is connected between the nodes 1104 and 1114.

A transmission gate 1118 is connected between the node 1104 and the non-inverting input of an op-amp 1120. The transmission gate 1118 is supplied with complementary signals 1122 and 1124, such that the transmission gate 1118 is essentially a short circuit when the signal 1122 is high (and the signal 1124 is low), and an open circuit when the signal 1122 is low (and the signal 1124 is high). The transmission gate 1118, and any other transmission gates supplied with the signals 122 and 1124 in this manner, are referred to herein as S9 type transmission gates.

A S9 type transmission gate 1126 is connected between the node 1114 and the inverting input of the op-amp 1120.

A transmission gate 1128 is connected between a half reference voltage 1130 and the non-inverting input of the op-amp 1120. The transmission gate 1128 is supplied with complementary signals 1132 and 1134, such that the transmission gate 1128 is essentially a short circuit when the signal 1132 is high (and the signal 1134 is low), and an open circuit when the signal 1132 is low (and the signal 1134 is high). The signal 1134 corresponds to a gain input to the circuit 1000. The transmission gate 1128, and any other transmission gates supplied with the signals 1132 and 1134 in this manner, are referred to herein as S10 type transmission gates.

A transmission gate 1136 is connected between a reference voltage 1138 and the non-inverting input of the op-amp 1120. The transmission gate 1136 is supplied with complementary signals 1130 and 1142, such that the transmission gate 1136 is essentially a short circuit when the signal 1140 is high (and the signal 1142 is low), and an open circuit when the signal 1140 is low (and the signal 1142 is high). The signal 1140 corresponds to the gain input to the circuit 1000. Therefore, the gain input effectively selects which transmission gate 1128 or 1136 acts as a closed circuit, and the other transmission gate will effectively be an open circuit.

A capacitor 1144 is connected between the output of the op-amp 1120 and the inverting input of the op-amp 1120. A S8 type transmission gate 1146 is also connected between the output and inverting input of the op-amp 1120.

A S10 type transmission gate 1148 is connected between a node 1150 and the inverting input of the op-amp 1120. A S10 type transmission gate 1156 is connected between a node 1158 and the output of the op-amp 1120. A capacitor 1160 is connected between the nodes 1150 and 1158. The capacitors 1144 and 1160 are half the size of the capacitor. Therefore, by selecting whether the capacitor 1160 is within the feedback path of the op-amp 1120 using the transmission gates 1148 and 1156, the gain of the circuit 1000 can be selected as one or two. In other embodiments, however, where different gains are required, the relative sizes of the capacitors 1116, 1144 and 1160 can be adjusted accordingly.

The output of the op-amp 1120 comprises the signal 1002 which is supplied to the ample and hold circuit 1004 as shown in FIG. 11.

Figure 12:
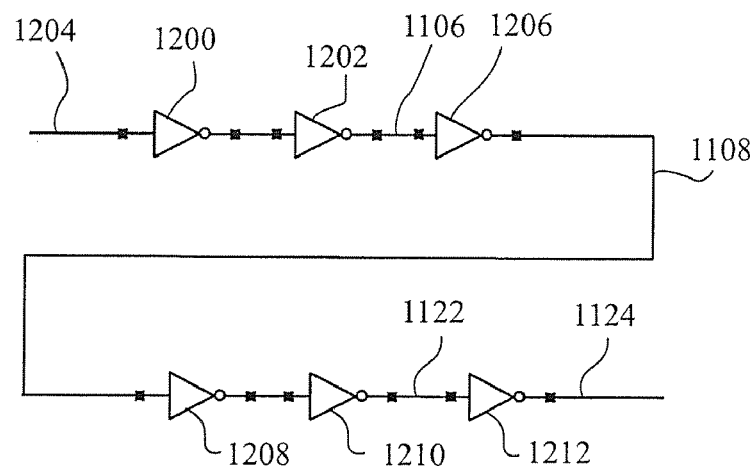
FIG. 12 shows part of an embodiment of a differential sample and hold circuit.

FIG. 12 shows another part of the differential sample and hold circuit 1000 in more detail. The circuit 1000 includes two series connected inverters 1200 and 1202. A strobe input 1204 is provided to the input of the inverter 1200. The output of the inverter 1202 comprises the signal 1106, which is provided to the S8 type transmission gates. The signal 1106 is provided to the input of an inverter 1206. The output of the inverter 1206 comprises the signal 1108, which is provided to the S8 type transmission gates. The strobe input 1204 is provided to the circuit 1000 by the controller 112 via the control signal 1006.

The signal 1108 is provided to the input of an inverter 1208. The output of the inverter 1208 is provided to the input of an inverter 1210. The output of the inverter 1210 comprises the signal 1122, which is provided to the S9 type transmission gates. The signal 1122 is provided to the input of an inverter 1212. The output of the inverter 1212 comprises the signal 1124, which is provided to the S9 type transmission gates.

The signals 1106 and 1124 are generally at the same logic level. The signals 1108 and 1122 are generally at the same logic level. When the strobe input changes (for example, from low to high or high to low), the signals 1106 and 1108 change before the signals 1122 and 1124, due to the additional propagation delay of the inverters 1208, 1210 and 1212. This ensures, for example, that the input 1112 and the capacitor 1116 of the circuit in FIG. 11 are not simultaneously connected to the inverting input of the op-amp 1120.

An example of the operation of the differential sample and hold circuit 1000 will now be described, with reference to FIG. 11. In the described example, the gain input is high, indicating that the range of the output voltage 1002 should be 0–2*Vref. The reference voltage Vref 1138 is chosen to be 1.2 V, and the half reference voltage 1130 is chosen to be 0.6 V, i.e. Vref/2. With the gain input high, the S10 type transmission gates are effectively open circuits, and the transmission gate 1136 is effectively a closed circuit, connecting the reference voltage Vref 1138 to the non-inverting input of the op-amp 1120.

When the strobe input changes from low to high, the S9 type transmission gates become effectively open circuits, and the S8 type transmission gates become effectively closed circuits. The capacitor 1116 is therefore connected between the differential input voltages 1102 and 1112. The capacitor 1144 in the op-amp feedback path is shortened by the transmission gate 1146. While the strobe input is high i.e. during the sample period, the output voltage 1002 is the voltage at the non-inverting input of the op-amp 1120. With the gain input high, this voltage is Vref, and is the mid-point of the range of the output voltage 1002. When the gain input is low, this voltage is Vref/2. The single-sample and hold circuit 1004 is used to sample the output of the differential sample and hold circuit 1000 so that the output 138 from the output sample and hold circuit 134 does not return to the voltage Vref or Vref/2 during the sample period of the differential sample and hold circuit 1000.

When the strobe input changes from high to low, the S8 type transmission gates effectively become open circuits, and a sampled voltage remains across the capacitor 1116. The S9 type transmission gates then become closed circuits, and the capacitor 1116 is connected across the inputs of the op-amp 1120. The voltage at the non-inverting input of the op-amp 1120 is the reference voltage Vref 1138. Due to the feedback path, the inverting input of the op-amp 1120 is also held at Vref. The charge in the capacitor 1116 is therefore redistributed into the capacitor 1144 in the feedback path. The output voltage Vout 1002 is therefore defined as follows:

$$Vout=Vref+((IP+IN)*2) \quad (7)$$

where

IP is the input 1102, and

IN is the input 1112.

If the gain input is low, the output voltage is defined as:

$$Vout=Vref/2+(IP-IN) \quad (8)$$

After a delay to allow the output voltage 1002 from the circuit 1000 to settle, the controller 112 instructs the sample and hold circuit 1004 via the control signal 1008 to sample the voltage 1002 and provide a sampled and held voltage 138. The voltage 138 is provided as an output from the ADC 100 when in the digital to analogue converter mode.

In the described embodiment of the invention, the gain input of the differential sample and hold circuit 1000 is fixed at low. The input 1002 to the single-ended sample and hold circuit 1004 therefore has a range of 0-1.2 V rather than 0-2.4 V. The single-ended sample and hold circuit 1004 can therefore be designed to accommodate the lower range. This may result in a simpler and/or more cost-effective and/or more efficient design.

Figure 13:
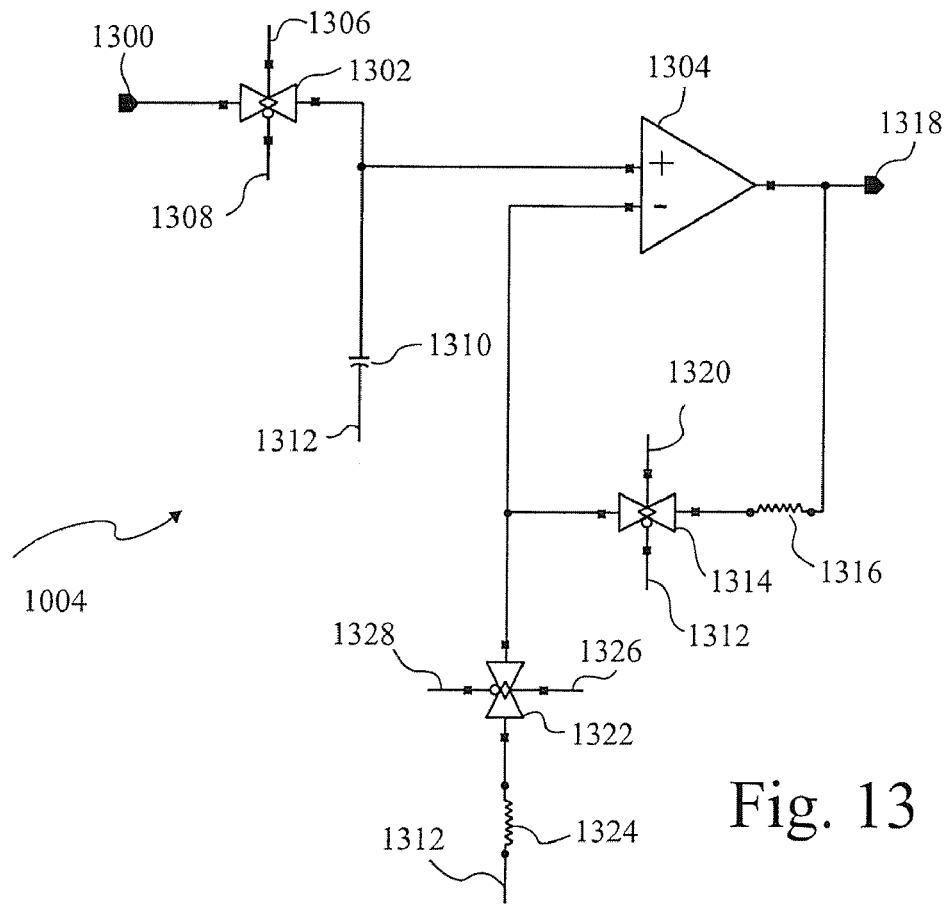
FIG. 13 shows an example of an embodiment of a single-ended sample and hold circuit.

To achieve a high gain, the single-ended sample and hold circuit also includes a gain input which is used to select a gain of either 1 or 2. FIG. 13 shows the single-ended sample and hold circuit 1004 in more detail. The circuit 1004 includes an input 1300 which is connected to the output 1002 from the differential sample and hold circuit 1000 shown in FIG. 10. A transmission gate 1302 is connected between the input 1300 and the positive input of an op-amp 1304. The transmission gate 1302 is supplied with complementary signals 1306 and 1308, such that the transmission gate 1302 is essentially a short circuit when the signal 1306 is high (and the signal 1308 is low), and an open circuit when the signal 1306 is low (and the signal is high). A capacitor 1310 is connected between the positive input of the op-amp 1304 and a Vss power supply voltage 1312.

The signal 1306 corresponds to a sample input to the circuit 1004. The sample input is provided by the controller 112 via the control signal 142 and the control signal 1008 shown in FIG. 10.

A transmission gate 1314 and a resistor 1316 are connected in series between the negative input and the output 1318 of the op-amp 1304. The output 1318 corresponds to the output 138 of the circuit 1004 shown in FIG. 10. The transmission gate 1314 is connected to a Vdd power supply voltage 1320 and the Vss power supply voltage 1312 such that it is constantly effectively a short circuit.

A transmission gate 1322 and a resistor 1324 are connected in series between the negative input of the op-amp 1304 and the Vss power supply voltage 1312. The transmission gate 1322 is supplied with complementary signals 1326 and 1328, such that the transmission gate 1322 is essentially a short circuit when the signal 1326 is high (and the signal 1328 is low), and an open circuit when the signal 1326 is low (and signal 1328 is high). The signal 1326 corresponds to the gain input to the circuit 1004. The resistors 1316 and 1324 are identical or substantially identical in size.

When the sample input to the circuit 1004 goes high, the input voltage 1300 is stored across the capacitor 1310. When the sample input goes low, and the gain input is low, the voltage is held at the output 1318 until the sample input goes high again. If the gain input is high, the resistor 1324 is introduced into the feedback circuit and the gain of the circuit 1004 becomes two. In alternative embodiments, the relative sizes of the resistors 1316 and 1324 can be adjusted to set a desired gain.

In certain embodiments, when the input sample and hold circuit (such as, for example, the input sample and hold circuit 102 shown in FIG. 1) is sampling the input voltage i.e. when the strobe input to the input sample and hold circuit is high, the DAC in the ADC is idle. Therefore, the DAC can be used to perform a digital to analogue conversion on the inputs 150 and 152 while the input sample and hold circuit is sampling the analogue input signal. Once the outputs of the DAC which correspond to the digital inputs 150 and 152 have been sampled and held by the output sample and hold circuits 138 and 140, the DAC may then be used in an analogue to digital conversion of the voltage sampled and held by the input sample and hold circuit 104. Therefore, the ADC 100 can effectively be used in both digital to analogue conversion mode and analogue to digital conversion mode simultaneously without any loss of throughput.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purposes, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. An analogue to digital converter comprising:
   a dual differential digital to analogue converter (DAC) having first and second digital inputs for first and second digital input signals, respectively, and having first and second analogue differential output for first and second differential output signals respectively, where the first and second differential output signals are associated with the first and second digital inputs respectively;
   storage for storing a DAC digital input value;
   logic for deriving the first and second digital input signals from the DAC digital input value, such that the difference between the first and second differential output signals from the DAC represents the DAC digital input value;
   a comparator for comparing the first and second differential output signals from the DAC with an analogue input signal and providing a comparator output; and a controller, responsive to the comparator output, for modifying the DAC digital input value such that the DAC digital input value substantially represents the analogue input signal.

2. An analogue to digital converter as claimed in claim 1, wherein the analogue input signal is a differential voltage.

3. An analogue to digital converter as claimed in claim 2, wherein the comparator compares the difference between the first and second differential output signals from the DAC with twice the differential input voltage.

4. An analogue to digital converter as claimed in claim 1, wherein the controller modifies an intermediate digital value so that the intermediate digital value substantially represents the analogue input signal and the intermediate digital value is provided as an output from the analogue to digital converter.

5. An analogue to digital converter as claimed in claim 4, wherein the intermediate digital value is provided as the output from the analogue to digital converter wherein the intermediate digital value substantially represents the analogue input signal.

6. An analogue to digital converter as claimed in claim 4, wherein the first input signal to the DAC comprises the intermediate digital value with the least significant bit discarded.

7. An analogue to digital converter as claimed in claim 4, wherein the second input signal to the DAC comprises the two's complement of the intermediate digital value, with the least significant bit of the two's complement discarded.

8. An analogue to digital converter as claimed in claim 1, comprising an input sample and hold circuit for sampling the analogue input signal and providing the sampled analogue input signal to the comparator.

9. An analogue to digital converter as claimed in claim 1, wherein the sample and hold circuit is a differential sample and hold circuit, and the sample and hold circuit samples the analogue input signal and provides differential sampled input voltage to the comparator.

10. An analogue to digital converter as claimed in claim 4, wherein the intermediate digital value is a n-bit value.

11. An analogue to digital converter as claimed in claim 10, wherein the first and second digital input signals to the DAC comprise (n-1)-bit value.

12. An analogue to digital converter as claimed in claim 10, wherein the DAC comprises a (n-2) bit resistor string.

13. An analogue to digital converter as claimed in claim 1, wherein the controller modifies the DAC digital input value using successive approximation such that the DAC digital input value substantially represents the analogue input signal.

14. An analogue to digital converter as claimed in claim 4, wherein the controller modifies the intermediate digital value using successive approximation such that the intermediate digital value substantially represents the analogue input signal.

15. An analogue to digital converter as claimed in claim 1, comprising first and second output sample and hold circuits for sampling the first and second differential output signals from the DAC respectively when the analogue to digital converter is in a digital to analogue converter mode.

16. An analogue to digital converter as claimed in claim 1, wherein the logic for deriving the first and second digital input signals for the DAC includes first and second digital inputs, and the logic passes the digital inputs to the DAC when the analogue to digital converter is in a digital to analogue converter mode.

17. A method of analogue to digital conversion, comprising:
providing a DAC digital input value to a dual differential digital to analogue converter (DAC), such that a difference between first and second differential output signals from the DAC substantially represents the DAC digital input value;
comparing the output signals from the DAC with an analogue input signal; and
modifying the DAC digital input value in response to the comparison such that the DAC digital input value substantially represents the analogue input signal.

18. A method as claimed in claim 17, wherein providing the analogue input signal to the comparator comprises sampling and holding the analogue input signal, and providing a sampled input voltage the comparator.

19. A method as claimed in claim 18, wherein sampled input voltage provided to the comparator is a differential voltage.

20. A method as claimed in claim 19, comprising comparing the first and second differential output signals from the DAC with twice the differential sampled input voltage.

21. A method as claimed in claim 17, wherein providing a DAC digital input value to the DAC comprises:
providing the DAC digital input value, with the least significant bit discarded, to a first input of the DAC; and
providing the two's complement of the DAC digital input value, with the least significant bit of the two's complement discarded, to a second input of the DAC.

22. A method as claimed in claim 17, wherein modifying the DAC digital input value comprises using successive approximation to modify the DAC digital input value such that the DAC digital input substantially represents the analogue input signal.

23. A method as claimed in claim 17, wherein modifying the DAC digital input value comprises using successive approximation to modify the DAC digital input value such that the DAC digital input value substantially represents the analogue input signal.

24. A system for carrying out the method as claimed in claim 17.

25. An n-bit analogue to digital converter, comprising:
a dual differential string digital to analogue converter (DAC) having first and second digital inputs for first and second (n-1)-bit digital input signals respectively, and having first and second analogue differential outputs for first and second digital output signals respectively, where the first and second differential output signals are associated with the first and second digital input signals respectively, and where the DAC contains an (n-2)-bit resistor string;
storage for storing an n-bit DAC digital input value;
logic for deriving the first and second digital input signals from the DAC digital input value, such that the difference between the first and second digital output signals from the DAC represents the DAC digital input value;
an input sample and hold circuit for sampling a single-ended input voltage to obtain a differential sampled input voltage;
a comparator for comparing the first and second differential output signals from the DAC with the differential sampled input voltage and providing a comparator output;
a controller, responsive to the comparator output, for modifying the DAC digital input value and an intermediate digital value using successive approximation such that the DAC digital input value and the intermediate digital value substantially represents the input voltage;

first and second output sample and hold circuits for sampling and holding the first and second differential output signals respectively from the DAC; and a n-bit output for the intermediate digital value when the intermediate digital value substantially represents the input voltage.

\* \* \* \* \*